(12) United States Patent
Misaki et al.

(10) Patent No.: US 7,226,659 B2
(45) Date of Patent: Jun. 5, 2007

(54) HIGH WEAR RESISTANT HARD FILM

(75) Inventors: Masanobu Misaki, Shiga-ken (JP); Yukio Kodama, Shiga-ken (JP); Yozo Nakamura, Shiga-ken (JP); Yoshihiro Wada, Shiga-ken (JP); Toyoaki Yasui, Hiroshima-ken (JP); Toshirou Kobayashi, Hiroshima-ken (JP); Katsuyasu Hananaka, Hiroshima-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 217 days.

(21) Appl. No.: 10/866,869

(22) Filed: Jun. 15, 2004

(65) Prior Publication Data
US 2005/0019613 A1 Jan. 27, 2005

(30) Foreign Application Priority Data
Jul. 25, 2003 (JP) .............................. 2003-201436

(51) Int. Cl.
*C23C 14/06* (2006.01)
(52) U.S. Cl. .................. 428/336; 428/697; 428/698; 428/699
(58) Field of Classification Search ................ 428/336, 428/698, 697, 699
See application file for complete search history.

(56) References Cited

U.S. PATENT DOCUMENTS 6,492,011 B1 * 12/2002 Brandle et al. ............. 428/217

FOREIGN PATENT DOCUMENTS

| EP | 709 483 | * | 5/1996 |
| EP | 0999290 A1 | | 5/2000 |
| JP | 4-246164 A | | 9/1992 |
| JP | 4-337064 A | | 11/1992 |
| JP | 6-220608 A | | 8/1994 |
| JP | 10-25566 A | | 1/1998 |
| JP | 2000-326108 A | | 11/2000 |
| JP | 2001-179506 A | | 7/2001 |
| JP | 2002-337005 A | | 11/2002 |
| JP | 2002-337006 A | | 11/2002 |
| JP | 2002-337007 A | | 11/2002 |
| JP | 2003-25113 A | | 1/2003 |
| JP | 2003-89004 A | | 3/2003 |

* cited by examiner

*Primary Examiner*—Archene Turner
(74) *Attorney, Agent, or Firm*—Birch, Stewart, Kolasch & Birch, LLP

(57) ABSTRACT

A high wear resistant hard film is characterized by including a coating layer consisting of a metal nitride, which is formed on the outside surface of an object to be treated; a substrate layer consisting of a nitride of Ti or Cr, which is provided between the coating layer and the object to be treated; and an intermediate layer containing compositions of the coating layer in contact with the intermediate layer and the substrate layer, which is provided at an interface between the coating layer and the substrate layer, and a tool is provided with the film. There is provided a hard film having excellent oxidation resistance even at 1000° C. or higher and also having very high wear resistance.

6 Claims, 2 Drawing Sheets

HIGH WEAR RESISTANT HARD FILM

FIELD OF THE INVENTION

The present invention relates to a hard film excellent in high temperature oxidation resistance, which is formed on a base material by using the physical vapor deposition method to dramatically improve wear resistance.

BACKGROUND OF THE INVENTION

Conventionally, there have been developed techniques for forming a hard film on a base material by using a physical vapor deposition method, such as that represented by ion plating. Among these films, a TiN film has been put to practical use most widely, and used for tools, metal molds, and spectacles and other accessories. However, since this film begins oxidizing at 500° C. or higher, it cannot be used for parts, tools, molds, and the like which are exposed to high temperatures. As a solution to this problem, a TiAlN film has been developed. This film can be used even at high temperatures up to about 800° C. because of restrained oxidation, but at temperatures higher than 800° C., like the aforementioned TiN film, it is difficult to use because it is deteriorated by oxidation.

On the other hand, an Al—Cr—N film has been proposed as a film capable of being used at high temperatures. This film can be used at high temperatures up to about 1000° C. (refer to Japanese Patent Provisional Publication No. 10-25566 (No. 25566/1998)). However, this film has a problem with its adhesiveness, and also has a problem of wear resistance when it is used for products and parts that are subjected to a high load. To obtain a hard film having oxidation resistance, studies have been carried out to improve the wear resistance of Al—Cr based nitrides. However, a film having sufficient performance has not yet been obtained from the viewpoint of adhesive force and the adhesive properties of film adhering to an object to be treated.

SUMMARY OF THE INVENTION

To solve the above problems, the inventors earnestly conducted studies to develop a hard film having excellent oxidation resistance even at 1000° C. or higher and also having very high wear resistance.

As a result, the inventors found that the above-described problems can be solved by a laminated structure in which an intermediate layer formed of compositions of a surface coating layer and a substrate layer is provided at the interface between the surface coating layer and the substrate layer. The present invention has been completed from this point of view.

Accordingly, the present invention provides a high wear resistant hard film including a coating layer consisting of a metal nitride, which is formed on the outside surface of an object to be treated; a substrate layer consisting of a nitride of Ti or Cr, which is provided between the coating layer and the object to be treated; and an intermediate layer containing compositions of the coating layer in contact with the intermediate layer and the substrate layer, which is provided at an interface between the coating layer and the substrate layer. The film thickness of the intermediate layer 20 is normally 0.1 to 2 µm, preferably 0.2 to 1.5 µm.

The coating layer is preferably formed of a metal nitride whose main components are Al, Cr and Si, and the composition of metal components is preferably 20–75 at. % Cr, 1–30 at. % Si, the balance being Al. Also, the composition ratio of the intermediate layer is normally 1:5 to 5:1, preferably 1:3 to 3:1, in the quantity ratio of composition of the substrate layer to the composition of the coating layer. More concretely, a case can be cited where, for example, the quantity ratio of the total of alloy components (AlCrSi) of AlCrSiN (coating layer composition) to the metal component of TiN or CrN (substrate layer composition) is 1:2 to 2:1.

The configuration can be such that the coating layer is a layer consisting of one or more layers in which there are alternately arranged a coating a layer, which is formed of a nitride whose main components are Al, Cr and Si, and a coating b layer, which is formed of a nitride whose main components are Ti and Al, containing 25–75 at. % Al, the balance being Ti, of metallic components only, and the outermost layer is formed by the coating a layer.

As a method for forming the coating layer and intermediate layer, a physical vapor deposition method such as the arc ion plating method can be used. The hard film in accordance with the present invention can be suitably used for a part or the whole of the surface of a cutting tool, such as a hob cutter, a pinion cutter, and a broach, or a part of the metal mold tool surface.

Figure 1:
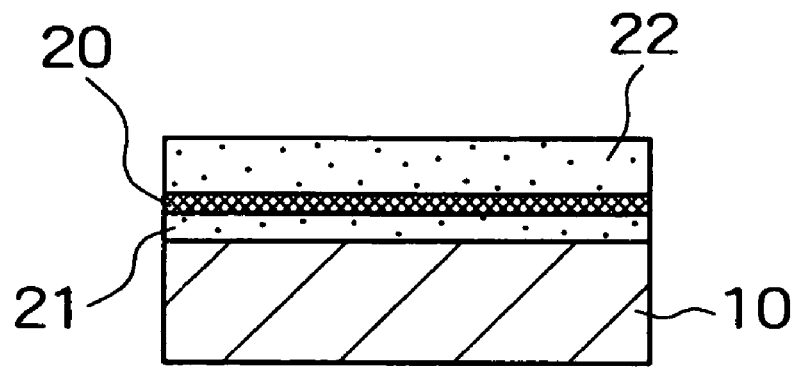
FIG. 1 is a sectional view showing a state in which a high wear resistant hard film in accordance with an embodiment of the present invention is adhered to the surface of a base material.

The reference numerals shown in these figures are defined as follows: 1, arc ion plating apparatus; 2, casing; 3, target; 4, vacuum pump; 5, gas source (Ar); 6, gas source ($N_2$); 7, holder; 8, motor; 9, rotating shaft; 10, base material; 11, power source; 13 to 15, control valve; 20, intermediate layer; 21, substrate layer; 22, coating layer, coating layer; 23, coating layer.

DETAILED DESCRIPTION OF THE INVENTION

An embodiment for carrying out a decarburizing method in accordance with the present invention will be described in detail. The present invention is not limited to the embodiment described below.

A high wear resistant hard film in accordance with the present invention will now be described with reference to the accompanying drawings.

As shown in FIG. 1, a film in accordance with the present invention includes a coating layer 22 on the outside surface, formed of a metal nitride, a substrate layer 21 between the coating layer 22 and a base material 10, which is an object to be treated, formed of a nitride of Ti or Cr, and an intermediate layer 20 at the interface between the coating layer 22 and the substrate layer 21, containing compositions of both layers.

First, the coating layer 22 consisting of a metal nitride, which is formed on the outside surface, is explained. A conventional TiAiN film (conventional example 1 described later), when used in a high-temperature atmosphere, is oxidized at about 800° C., whereby film strength and adhesion are decreased. Analyzing this oxidation state, Al and Ti of the film components are oxidized, and especially the oxide of Ti is very porous and allows oxygen to enter easily, so that the oxidization film becomes thick. Therefore, film strength and adhesion decrease, which leads to separation of the film. On the other hand, an AlCrN film (conventional example 2 described later) uses Cr in place of Ti, which forms a porous and thick oxidation film, so that a very thin oxidation film is produced. This oxidation layer prevents subsequent oxidation, thereby improving oxidation resistance. However, since the adhesiveness of the oxides of Al and Cr is low, this film separates when it is used for, for example, tools that are subjected to a high load, that is, this film has a problem in terms of wear resistance.

Accordingly, in the present invention, in order to prevent oxygen from entering and to enhance oxidation resistance, the coating layer 22 on the outside surface is suitably formed of a nitride of Al, Cr and Si. Thereby, the crystals are finely divided, and when the film is exposed to a high-temperature oxidizing atmosphere, the resultant oxides form an Al—Cr—Si composite oxidation film, so that oxygen is prevented from entering, and a very dense composite oxidation film can be obtained.

Concretely, the coating layer 22 is preferably formed of only metallic components of 20–75 at. % Cr, 1–30 at. % Si, the balance being Al. Silicon exerts a great influence on adhesiveness because it finely divides crystals, and the range of 1–30 at. % of metallic component only achieves an effect in terms of both adhesion and shock resistance. Regarding the content of chromium, 20–75 at. % Cr of metallic component only achieves an effect in terms of both hardness and oxidation resistance.

Figure 2:
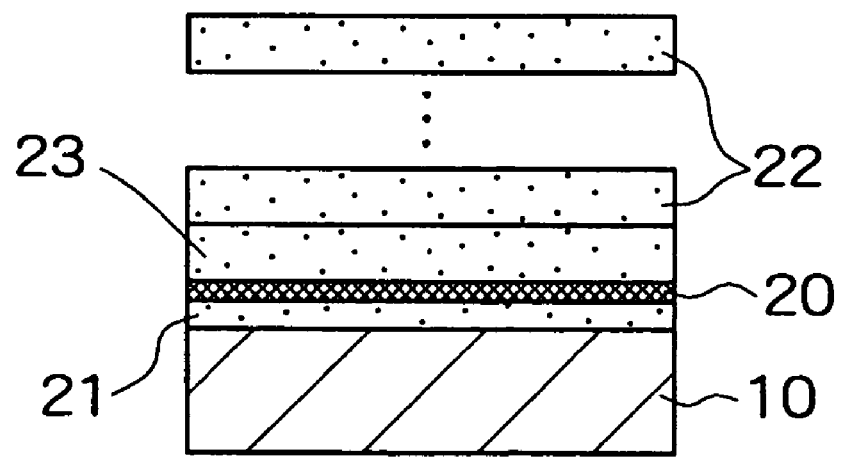
FIG. 2 is a sectional view showing a state in which two or more layers are laminated alternately as a coating layer in the film in accordance with the present invention.

On the other hand, as shown in FIG. 2, in order to further increase adhesiveness, the coating layer 22 may be a layer consisting of one or more layers in which there are alternately arranged a coating a layer 22, which is formed of the above-described nitride whose main components are Al, Cr and Si, and a coating b layer 23, which is formed of a nitride whose main components are Ti and Al, containing 25–75 at. % Al, the balance being Ti, of metallic components only, and the outermost layer is formed by the coating layer 22. Regarding the coating layer 22, a composition of 20–75 at. % Cr, 1–30 at. % Si, the balance being Al, of metallic components only of nitride is preferable. The lowermost coating layer in contact with the intermediate layer, described later, may be the coating a layer 22 or the coating layer 23 (FIG. 2). In the present invention, the lowermost coating layer is not limited to only one of the layer or the b layer.

Next, the substrate layer 21 formed of a nitride of Ti or Cr, having high adhesion to an object to be treated, is provided between the coating layer 22 and the base material 10 (object to be treated). The substrate layer 21 is formed of TiN or CrN, so that by providing the substrate layer 21, the adhesion between the coating layer 22 and the base material 10 (object to be treated) is improved.

In the present invention, furthermore, at the interface between the substrate layer 21 and the coating layer 22, the intermediate layer 20 formed of compositions of both layers is provided to enhance the adhesive force and adhesive properties of both layers. Specifically, when the coating layer 22 or the coating layer 22 is formed of a nitride of Al, Cr and Si, a layer in which (Al—Cr—Si)N and (Ti)N are mixed homogeneously with each other or a layer in which (Al—Cr—Si)N and (Cr)N are mixed homogeneously with each other forms the intermediate layer 20. The composition ratio of the intermediate layer is normally 1:5 to 5:1, preferably 1:3 to 3:1, further preferably 1:2 to 2:1, in the quantity ratio of composition of the substrate layer 21 to the composition of the coating layer 22. This quantity ratio of composition is the same in the case where the coating layer is formed of (Ti—Al)N like the aforementioned coating layer.

The film thickness of the intermediate layer 20 is normally 0.1 to 2 μm, preferably 0.2 to 1.5 μm. If the film thickness is smaller than 0.1 μm, the effect of adhesion provided by the intermediate layer is insufficient, and if the film thickness exceeds 2 μm, the ratio of film thickness of the intermediate layer to the total film thickness becomes high, which is unfavorable from the viewpoint of separation.

Figure 3:
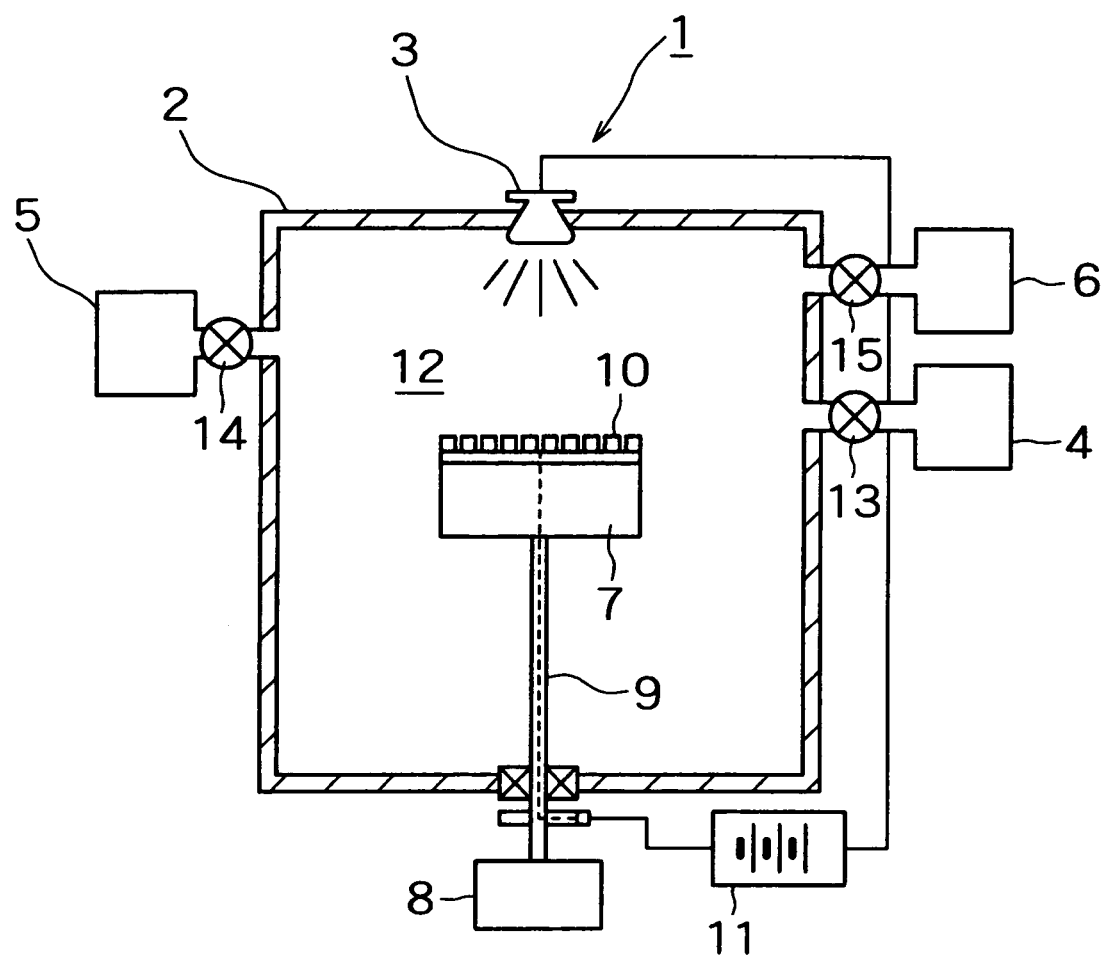
FIG. 3 is a schematic view of an arc ion plating apparatus for forming a high wear resistant hard film excellent in high temperature oxidation resistance in accordance with an embodiment of the present invention on a base material.

FIG. 3 schematically shows an arc ion plating apparatus 1 for forming the high wear resistant hard film in accordance with the present invention on the surface of base material. The arc ion plating apparatus 1 has an airtight casing 2, and is provided with a target 3 on the ceiling thereof and a table-shaped holder 7 in a chamber 12 of the casing 2. The holder 7 is connected to a motor 8 via a rotating shaft 9 so as to be rotatable in the circumferential direction. Between the target 3 and the holder 7, a DC power source 11 is connected. The target 3 is connected to the plus side of the power source 11, and the holder 7 is connected to the minus side thereof. FIG. 3 schematically shows a case where one target 3 is provided, but two or more targets 3 can be provided as necessary. In this case, the two or more targets 3 are provided at almost the same distance from the holder 7.

To the chamber 12 of the casing 2, a vacuum pump 4 for evacuating the chamber 12 is connected via a control valve 13, and an argon gas source 5 for supplying inert gas into the chamber 12 is connected via a control valve 14. Further, a nitrogen gas source 6 for supplying nitrogen into the chamber 12 is connected to the chamber 12 via a control valve 15.

In this embodiment, a film is formed by controlling the kind and number of targets for each layer formed on a base material 10. When a substrate layer is formed, pure titanium (Ti: 100%) or pure chromium (Cr: 100%) is used as the target 3. When an intermediate layer is formed, a plurality of targets are usually used, one being a target of the same metal as that of the substrate layer, and the other being a target of the same alloy as that of a coating layer on the outside surface. When the coating surface is formed, an alloy consisting of, for example, Al, Cr and Si is used as the target 3. As the base material 10, for example, SKH-51, which is a high-speed tool steel, or TH-10, which is a carbide material, can be used.

The base material 10 is placed on the holder 7, and of the control valves 13 to 15, the control valves 13 and 14 are opened to supply argon gas into the chamber 12 and to evacuate the chamber 12. After the evacuation has been completed and the chamber 12 has become under an argon atmosphere, the holder 7 is rotated by the motor 8. Then, the shutoff valves 13 and 14 are closed and a DC voltage is applied across the target 3 and the holder 7 to generate plasma, by which the temperature in the chamber 12 is raised. When the temperature in the chamber 12 reaches a fixed temperature, the control valve 15 is opened to supply nitrogen from the nitrogen gas source 6 into the chamber 12, and then arc discharge is produced. Thereby, the layers are formed on the base material 10, and thus a high wear resistant hard film excellent in high temperature oxidation resistance is obtained.

Such a high wear resistant hard film can be used for a part or the whole of the surface of a cutting tool, such as a hob cutter, a pinion cutter, and a broach, whose base material is formed of a high-speed tool steel or a carbide material, or a part of the tool surface of a metal mold etc., or the surface of an accessory such as spectacles. More specifically, the film can be formed on the surface of a tooth space shaped cutter for a machine tool performing gear cutting using, for example, a gear cutting cutter. The tool to which the film in accordance with the present invention is applied can be used satisfactorily even for dry cut machining in which cutting is performed without the use of a cutting fluid, and hence a tool with high wear resistance can be realized.

According to the film in accordance with the present invention, between the film (coating layer) of metal nitride and the substrate layer, the intermediate layer formed of compositions of both layers is provided to significantly enhance the adhesive force and adhesive properties of both layers. Therefore, this film has very excellent wear resistance, and hence the service life of a part or product coated with this film can be prolonged. Also, since the film in accordance with the present invention has very excellent oxidation resistance at high temperatures, the service life of a part or product coated with this film can be prolonged for this reason as well. Therefore, the film can be applied widely to surface treatment of a cutting tool, such as a hob cutter, a pinion cutter, and a broach, or surface treatment of a metal mold or an accessory such as spectacles. Also, the tool to which the film in accordance with the present invention is applied can be used satisfactorily even for dry cut machining in which cutting is performed without the use of a cutting fluid, and hence a tool with high wear resistance can be realized.

The following is a description of the present invention in more detail with reference to examples, and the present invention is not limited to these examples.

EXAMPLES

A film with a thickness of 4 to 7 μm was formed on a base material of high-speed tool steel (SKH-51) by using the arc ion plating apparatus shown in FIG. 3 using various types of alloy targets. A nitride film was provided as a substrate layer between the base material and a coating layer.

The film forming conditions were as shown in Table 1. A ball-on-disk wear test using an alumina ball (φ6) was conducted to evaluate wear resistance. The test conditions were 5N of load, 100 m/s of slip velocity, 300 m of slide distance, room temperature, and non lubrication. The amount of wear was determined by measuring a wear depth and wear width of coating layer after the wear test.

TABLE 1

| Pressure of $N_2$ gas (Pa) | Temperature of base material (K) | Bias voltage (V) |
|---|---|---|
| 2.7 | 673 | −40 |

Example 1

A substrate layer (film thickness: 1 μm) consisting of Ti nitride was formed beforehand on a base material by using the apparatus shown in FIG. 3 using a pure titanium (Ti: 100%) target. Next, an intermediate layer was formed by performing arc ion plating substantially uniformly from two targets. As the targets, both an alloy consisting of 50% Al, 40% Cr, and 10% Si and pure titanium (Ti: 100%) were used simultaneously. The composition ratio of alloy to titanium of the intermediate layer consisting of (Al—Cr—Si)N and (Ti)N was about 1:1. Finally, a coating layer (surface film layer) was formed by performing arc ion plating using a target of 50% Al, 40% Cr, and 10% Si. Thereby, a hard film of the present invention was obtained. The result was that the obtained film had a wear depth of 0.15 (μm) and a wear width of 0.19 (mm). The thickness of the intermediate layer was 0.1 μm, and the total thickness of film was 5.1 μm.

Example 2

After the substrate layer had been formed as in example 1; an intermediate layer was formed by performing arc ion plating by simultaneously using both an alloy consisting of 60% Al, 30% Cr, and 10% Si and pure titanium as targets. Next, a coating layer was formed by performing arc ion plating using an alloy consisting of 60% Al, 30% Cr, and 10% Si. Thereby, a hard film was obtained. The result was that the obtained film had a wear depth of 0.11 (μm) and a wear width of 0.15 (mm). The thickness of the intermediate layer was 0.5 μm, and the total thickness of film was 5.5 μm.

Example 3

After the substrate layer had been formed as in example 1, an intermediate layer was formed by performing arc ion plating by simultaneously using both an alloy consisting of 50% Al, 40% Cr, and 10% Si and pure titanium as targets. Next, a coating layer was formed by performing arc ion plating using an alloy consisting of 50% Al, 40% Cr, and 10% Si as a target. Thereby, a hard film was obtained. The result was that the obtained film had a wear depth of 0.12 (μm) and a wear width of 0.15 (mm). The thickness of the intermediate layer was 0.5 μm, and the total thickness of film was 5.5 μm.

Example 4

After the substrate layer had been formed as in example 3, an intermediate layer and a coating layer were formed by performing arc ion plating using the same targets, by which a hard film was obtained. The thickness of the intermediate layer was 2.0 μm. The result was that the obtained film had a wear depth of 0.13 (μm) and a wear width of 0.18 (mm). The total thickness of film was 7.0 μm.

Reference Example 1

A substrate layer (film thickness: 2 μm) consisting of Ti nitride was formed beforehand on a base material by using a pure titanium (Ti: 100%) target. Next, a coating layer (surface film layer) was formed by performing arc ion plating using an alloy of 50% Al, 40% Cr, and 10% Si as a target. Thereby, a hard film was obtained. The result was that the obtained film had a wear depth of 0.21 (μm) and a wear width of 0.23 (mm). The total thickness of film was 6.0 μm.

Example 5

A substrate layer (film thickness: 1 μm) consisting of Cr nitride was formed beforehand on a base material by using a pure chromium (Cr: 100%) target. Next, an intermediate layer was formed by performing arc ion plating substantially uniformly from two targets. As the targets, both an alloy consisting of 50% Al, 40% Cr, and 10% Si and pure chromium (Cr: 100%) were used simultaneously. The composition ratio of alloy to titanium of the intermediate layer consisting of (Al—Cr—Si)N and (Cr)N was about 1:1. Finally, a coating layer (film layer) was formed by performing arc ion plating using a target of 50% Al, 40% Cr, and 10% Si. Thereby, a hard film of the present invention was obtained. The result was that the obtained film had a wear depth of 0.15 (μm) and a wear width of 0.20 (mm). The thickness of the intermediate layer was 0.1 μm, and the total thickness of film was 5.1 μm.

Example 6

After the substrate layer had been formed as in example 5, an intermediate layer was formed by performing arc ion plating by simultaneously using both an alloy consisting of 60% Al, 30% Cr, and 10% Si and pure chromium as targets. Next,; a coating layer was formed by performing arc ion plating using an alloy consisting of 60% Al, 30% Cr, and 10% Si as a target. Thereby, a hard film was obtained. The result was that the obtained film had a wear depth of 0.10 (μm) and a wear width of 0.12 (mm). The thickness of the intermediate layer was 0.5 μm, and the total thickness of film was 5.5 μm.

Example 7

After the substrate layer had been formed as in example 5, an intermediate layer was formed by performing arc ion plating by simultaneously using both an alloy consisting of 50% Al, 40% Cr, and 10% Si and pure chromium as targets. Next, a coating layer was formed by performing arc ion plating using an alloy consisting of 50% Al, 40% Cr, and 10% Si as a target. Thereby, a hard film was obtained. The result was that the obtained film had a wear depth of 0.11 (μm) and a wear width of 0.15 (mm). The thickness of the intermediate layer was 0.5 μm, and the total thickness of film was 5.5 μm.

Example 8

After the substrate layer had been formed as in example 7, an intermediate layer and a coating layer were formed by performing arc ion plating using the same targets, by which a hard film was obtained. The thickness of the intermediate layer was 2.0 μm. The result was that the obtained film had a wear depth of 0.14 (μm) and a wear width of 0.18 (mm). The total thickness of film was 7.0 μm.

Reference Example 2

A substrate layer (film thickness: 2 μm) consisting of Cr nitride was formed beforehand on a base material by using a pure chromium (Cr: 100%) target. Next, a coating layer was formed by performing arc ion plating using an alloy of 50% Al, 40% Cr, and 10% Si as a target. Thereby, a hard film was obtained. The result was that the obtained film had a wear depth of 0.22 (μm) and a wear width of 0.26 (mm). The total thickness of film was 6.0 μm.

Comparative Example 1

A coating layer was formed by performing arc ion plating by using the apparatus shown in FIG. 3 using only an alloy of 50% Al, 40% Cr, and 10% Si as a target. The result was that the obtained film had a wear depth of 0.41 (μm) and a wear width of 0.31 (mm). The layer thickness was 4.0 μm.

Comparative Example 2

A substrate layer (film thickness: 0.1 μm) consisting of Ti nitride was formed beforehand on a base material by using a pure titanium (Ti: 100%) target. Next, a coating layer was formed by performing arc ion plating using an alloy of 50% Al, 40% Cr, and 10% Si as a target. Thereby, a hard film was obtained. The result was that the obtained film had a wear depth of 0.39 (μm) and a wear width of 0.31 (mm). The total thickness of layers was 4.1 μm.

Comparative Example 3

A substrate layer (film thickness: 0.1 μm) consisting of Cr nitride was formed beforehand on a base material by using a pure chromium (Cr: 100%) target. Next, a coating layer was formed by performing arc ion plating using an alloy of 50% Al, 40% Cr, and 10% Si as a target. Thereby, a hard film was obtained. The result was that the obtained film had a wear depth of 0.39 (μm) and a wear width of 0.30 (mm). The total thickness of layers was 4.1 μm.

Conventional Example 1

Arc ion plating was performed by using the apparatus shown in FIG. 3 using an alloy of 53% Ti and 47% Al as a target. The result was that the obtained film had a wear depth of 0.80 (μm) and a wear width of 0.40 (mm). The layer thickness was 4.0 μm.

Conventional Example 2

Arc ion plating was performed by using an alloy of 45% Al and 55% Cr as a target. The result was that the obtained film had a wear depth of 0.50 (μm) and a wear width of 0.32 (mm). The layer thickness was 4.0 μm.

Table 2 gives the measurement results of examples 1 to 8, reference examples 1 and 2, comparative examples 1 to 3, and conventional examples 1 and 2. These results reveal that the films in accordance with the present invention of examples 1 to 8 have a small wear depth and wear width, and hence have excellent wear resistance.

TABLE 2

| | Substrate layer | | Intermediate layer | | Outermost layer | | Wear resistance test | |
|---|---|---|---|---|---|---|---|---|
| | Composition | Film thickness (μm) | Present or absent | Film thickness (μm) | Composition | Film thickness (μm) | Wear depth (μm) | Wear width (mm) |
| Example 1 | TiN | 1 | Present | 0.1 | | 4 | 0.15 | 0.19 |
| Example 2 | TiN | 1 | Present | 0.5 | | 4 | 0.11 | 0.15 |
| Example 3 | TiN | 1 | Present | 0.5 | | 4 | 0.12 | 0.15 |
| Example 4 | TiN | 1 | Present | 2 | | 4 | 0.13 | 0.18 |

TABLE 2-continued

| | Substrate layer | | Intermediate layer | | Outermost layer | | Wear resistance test | |
|---|---|---|---|---|---|---|---|---|
| | Composition | Film thickness (μm) | Present or absent | Film thickness (μm) | Composition | Film thickness (μm) | Wear depth (μm) | Wear width (mm) |
| Reference example 1 | TiN | 2 | Absent | — | | 4 | 0.21 | 0.23 |
| Example 5 | CrN | 1 | Present | 0.1 | | 4 | 0.15 | 0.20 |
| Example 6 | CrN | 1 | Present | 0.5 | | 4 | 0.10 | 0.12 |
| Example 7 | CrN | 1 | Present | 0.5 | | 4 | 0.11 | 0.15 |
| Example 8 | CrN | 1 | Present | 2 | | 4 | 0.14 | 0.18 |
| Reference example 2 | CrN | 2 | Absent | — | | 4 | 0.22 | 0.26 |
| Comparative example 1 | — | — | Absent | — | | 4 | 0.41 | 0.31 |
| Comparative example 2 | TiN | 0.1 | Absent | — | | 4 | 0.39 | 0.31 |
| Comparative example 3 | CrN | 0.1 | Absent | — | | 4 | 0.39 | 0.30 |
| Conventional example 1 | — | — | Absent | — | | 4 | 0.80 | 0.40 |
| Conventional example 2 | — | — | Absent | — | | 4 | 0.50 | 0.32 |

The above is a description of one embodiment of the present invention. The present invention can be changed or modified variously based on the technical concept of the present invention.

For example, in forming the coating layer, the physical vapor deposition method is used, and any method for metal evaporation, such as an electron gun, a hollow cathode, sputtering, and arc discharge, can be used and is not subject to any restriction.

That which is claimed is:

1. A high wear resistant hard film comprising:
   a coating layer consisting of a composition of a metal nitride, which is formed on the outside surface of an object to be treated;
   a substrate layer consisting of a composition of a nitride of Cr, which is provided between said coating layer and said object to be treated; and
   an intermediate layer containing said compositions of i) said coating layer and ii) said substrate layer, wherein said compositions of said intermediate layer are located at an interface between said coating layer and said substrate layer,
   wherein said coating layer is formed of a metal nitride whose main components are Al, Cr and Si.

2. The high wear resistant hard film according to claim 1, wherein said intermediate layer has a film thickness of 0.1 to 2 mm.

3. The high wear resistant hard film according to claim 1 or 2, wherein the composition ratio of said intermediate layer is 1:5 to 5:1 in the quantity ratio of composition of said substrate layer to the composition of said coating layer.

4. The high wear resistant hard film according to claim 1 or 2, wherein said coating layer is a layer consisting of one or more layers in which there are alternately arranged a coating a layer, which is formed of a nitride whose main components are Al, Cr and Si, and a coating b layer, which is formed of a nitride whose main components are Ti and Al, containing 25–75 percent by atom of Al, the balance being Ti, of metallic components only, and an outermost layer is formed by said coating a layer.

5. A high wear resistant hard film comprising:
   a coating layer comprising a composition of a metal nitride, which is formed on the outside surface of an object to be treated;
   a substrate layer comprising a composition of a nitride of Cr, which is provided between said coating layer and said object to be treated; and
   an intermediate layer comprising said compositions of i) said coating layer and ii) said substrate layer, wherein said compositions of the intermediate layer are located at an interface between said coating layer and said substrate layer,
   wherein said coating layer is formed of a metal nitride whose main components comprise Al, Cr and Si.

6. A high wear resistant hard film comprising:
   a coating layer comprising a composition of a metal nitride, which is formed on the outside surface of an object to be treated;
   a substrate layer consisting essentially of a composition of a nitride of Cr, which is provide between said coating layer and said object to be treated; and
   an intermediate layer comprising said compositions of i) said coating layer and ii) said substrate layer, wherein said compositions of the intermediate layer are located at an interface between said coating layer and said substrate layer,
   wherein said coating layer is formed of a metal nitride whose main components comprise Al, Cr and Si.

* * * * *